(12) United States Patent
Schrier et al.

(10) Patent No.: US 7,695,642 B2
(45) Date of Patent: Apr. 13, 2010

(54) PREPARATION OF STABLE, BRIGHT LUMINESCENT NANOPARTICLES HAVING COMPOSITIONALLY ENGINEERED PROPERTIES

(75) Inventors: Marc D. Schrier, El Granada, CA (US); Donald A. Zehnder, San Carlos, CA (US); Joseph A. Treadway, Fremont, CA (US); Joseph A. Bartel, Dublin, CA (US)

(73) Assignee: Life Technologies Corporation, Carlsbad, CA (US)

( * ) Notice: Subject to any disclaimer, the term of this patent is extended or adjusted under 35 U.S.C. 154(b) by 80 days.

(21) Appl. No.: 11/011,827

(22) Filed: Dec. 13, 2004

(65) Prior Publication Data

US 2005/0214536 A1    Sep. 29, 2005

Related U.S. Application Data

(60) Provisional application No. 60/529,058, filed on Dec. 12, 2003.

(51) Int. Cl.
*C09K 11/88*    (2006.01)
(52) U.S. Cl. ............................ 252/301.6 S; 428/403; 977/824; 977/834
(58) Field of Classification Search .................. 428/403; 423/299, 409, 509, 566.1, 593.1; 252/301.6 S, 252/301.4 S, 301.6 R, 301.4 R; 977/773–776, 977/813, 815, 816, 818–821, 824, 834
See application file for complete search history.

(56) References Cited

U.S. PATENT DOCUMENTS 5,882,779 A    3/1999    Lawandy
6,207,229 B1 *    3/2001    Bawendi et al. ............. 427/215
6,207,299 B1 *    3/2001    Krauth et al. ............... 428/653
6,225,198 B1    5/2001    Alivisatos et al.
6,235,540 B1    5/2001    Siiman et al.
6,306,736 B1    10/2001    Alivisatos et al.
6,322,901 B1    11/2001    Bawendi et al.
6,379,583 B1    4/2002    Gray et al.
6,576,291 B2    6/2003    Bawendi et al.

(Continued)

OTHER PUBLICATIONS

N. Murase, "Single-particle spectroscopy of doped nanocrsytals at room temperature. Te:CdSe", Chem. Phy. Lett. vol. 368, issue 1-2, pp. 76-81, Dec. 7, 2002.*

(Continued)

*Primary Examiner*—C Melissa Koslow

(57) ABSTRACT

A method is provided for preparing luminescent semiconductor nanoparticles composed of a first component X, a second component A, and a third component B, wherein X, A, and B are different, by combining B with X and A in an amount such that the molar ratio B:(A+B) is in the range of approximately 0.001 to 0.20 and the molar ratio X:(A+B) is in the range of approximately 0.5:1.0 to 2:1. The characteristics of the thus-prepared nanoparticles can be substantially similar to those of nanoparticles containing only X and B while maintaining many useful properties characteristic of nanoparticles containing only X and A. The nanoparticles so prepared can additionally exhibit emergent properties such as a peak emission energy less than that characteristic of a particle composed of XA or XB alone; this method is particularly applicable to the preparation of stable, bright nanoparticles that emit in the red to infrared regions of the electromagnetic spectrum. Luminescent semiconductor nanoparticles having exemplary properties are also provided.

4 Claims, 4 Drawing Sheets

U.S. PATENT DOCUMENTS

| | | | |
|---|---|---|---|
| 6,649,138 | B2 | 11/2003 | Adams et al. |
| 6,815,064 | B2 | 11/2004 | Treadway et al. |
| 2001/0033371 | A1* | 10/2001 | Lawandy ..................... 356/71 |
| 2002/0066401 | A1 | 6/2002 | Peng et al. |
| 2003/0017264 | A1* | 1/2003 | Treadway et al. ........... 427/212 |
| 2003/0097976 | A1* | 5/2003 | Zehnder et al. ............... 117/68 |
| 2006/0028882 | A1* | 2/2006 | Qu ........................ 365/189.07 |
| 2007/0111324 | A1 | 5/2007 | Nie et al. |

OTHER PUBLICATIONS

Åkerman et al. (2002), "Nanocrystal targeting in vivo," *Proc. Nat. Acad. Sci. USA* 99:12617-12621.

Bailey and Nie, (2003), "Alloyed Semiconductor.Quantum Dots: Tuning the Optical Properties without Changing the Particle Size," *J. Am. Chem. Soc.* 125(23):7100-7106.

Larson et al. (2003), "Water-Soluble Quantum Dots for Multiphoton Fluorescence Imaging In Vivo," *Science* 300:1434-1436 (including supplemental online material).

Manna et al. (2002), "Epitaxial Growth and Photochemical Annealing of Graded CdS/ZnS Shells on Colloidal CdSe Nanorods," *J. Am. Chem. Soc.* 124(24):7136-7145.

Qu et al. (2001), "Alternative Routes Toward High Quality CdSe Nanocrystals," *Nano Lett.*, 1(6):333-337.

Rao et al. (2002), "Size-Dependent Chemistry: Properties of Nanocrystals," *Chem. Eur. J.* 8(1):28-35.

Zhong et al. (2003), "Composition-Tunable, $Zn_xCd_{1-x}Se$ Nanocrystals with High Luminescence and Stability," *J. Am. Chem. Soc.* 125(26):8589-8594.

\* cited by examiner

PREPARATION OF STABLE, BRIGHT LUMINESCENT NANOPARTICLES HAVING COMPOSITIONALLY ENGINEERED PROPERTIES

CROSS REFERENCE TO RELATED APPLICATIONS

This application claims priority under 35 U.S.C. § 119(e)(1) to U.S. Provisional Application Ser. No. 60/529,058, filed Dec. 12, 2003, the disclosure of which is incorporated by reference in its entirety.

TECHNICAL FIELD

The present invention relates generally to luminescent nanoparticles, and more particularly relates to the preparation of luminescent semiconductor nanoparticles in a manner that enables compositional tuning of electronic and optical properties without a change in particle size or a significant change in composition.

BACKGROUND

Semiconductor nanocrystals, or "quantum dots," are particles whose radii are smaller than the bulk exciton Bohr radius and constitute a class of materials intermediate between molecular and bulk forms of matter. Quantum confinement of both the electron and hole in all three dimensions leads to an increase in the effective band gap of the material with decreasing crystallite size. Consequently, both the optical absorption and emission of semiconductor nanocrystals shift to the blue (higher energies) as the size of the nanocrystals gets smaller.

Quantum dots are composed of an inorganic, crystalline, semiconductive material and have unique photophysical, photochemical, and nonlinear optical properties arising from quantum size effects, and have therefore attracted a great deal of attention because of their potential applicability in a variety of contexts, e.g., in biological detection, light-to-chemical or light-to-electrical energy conversion schemes, catalysis, displays, and telecommunications. Quantum dots are characterized by size-dependent properties such as peak emission wavelength and quantum yield. These crystals generally vary in size from about 1 nm to 100 nm and may be variously composed of elements, alloys, or other compounds. The desirable properties of quantum dots differ depending on the field of use, but a "tunable" peak emission wavelength, chemical stability, and photochemical stability are generally viewed as very important regardless of context.

For emission in the visible region of the electromagnetic spectrum, cadmium selenide (CdSe) materials have by far been the most important class of quantum dots, largely because they exhibit size-dependent luminescence tunable throughout the visible wavelength range. That is, by changing the particle size of CdSe quantum dots, the emission can be varied throughout most of the visible wavelength region. Proper selection of synthetic conditions furthermore allows the preparation of exceptionally bright quantum dots with luminescence efficiencies approaching unity (i.e. one emitted photon for every absorbed photon). Unfortunately, these CdSe-based quantum dots suffer from less than ideal stability characteristics, particularly with regard to chemical degradation and photooxidation. Emission from the nanocrystals is fairly easily and irreversibly quenched under conditions common in, for example, biological assays and biomedical labeling applications.

A key innovation that has significantly increased the utility of quantum dots is the addition of a discrete inorganic shell over the nanoparticle core. That is, decomposition pathways in many quantum dots, including CdSe nanocrystals, usually involve the formation of defects known as traps on the surfaces of the quantum dots. The key to ensuring and maintaining quantum dot emission is to passivate these surface sites. Some have had reasonable success in passivating nanocrystal surfaces using organic capping materials such as an alkylamine or trioctylphosphine oxide, but thus far these approaches have proven inadequate, dramatically decreasing luminescence intensity and resulting in nanoparticles that are insufficiently robust for many applications including biological detection. The use of inorganic compounds as capping agents has proven far more successful, providing that the material used is optically non-interfering, chemically stable, and lattice-matched to the underlying material. This last property is particularly important, since matching the lattices, i.e., minimizing the differences between the shell and core crystallographic structure, minimizes the likelihood of local defects, shell cracking, and formation of long-range defects. Typically, a large band gap semiconducting material such as zinc sulfide (ZnS) will be used to epitaxially overcoat nanocrystal cores with a crystalline shell that matches the underlying lattice. In other words, crystalline growth of a core material such as CdSe can be halted and then continued using a related crystalline material such as ZnS to form the shell. While this outer material doesn't necessarily contribute directly to the size-tunable properties of interest such as peak emission wavelength, such a passivating layer can have a substantial indirect impact. For example, the brightness of core-shell materials often far exceeds that of base nanoparticle core materials. Additionally, resistance to chemical and photochemical decomposition is often markedly increased.

Though not often recognized, such shell chemistry can be critically important to the utility of quantum dots, at least in applications that require certain stable properties such as predictable non-fluctuating emission characteristics. Indeed, it has been the invention of the core-shell concept that has resulted in recent attempts to commercialize quantum dot technology in several fields, including biotechnology and solar energy applications.

Not only is the composition of the shell of central importance to the characteristics of the final quantum dot, but the method of depositing the shell material is important as well. High quality inorganic shells must be thick enough to be sufficiently protective, and, ideally, are intimately wed to the underlying core. The reason for the latter requirement is that core crystals and shell crystals seldom have completely matched lattice spacings. For example, with a CdSe/ZnS nanoparticle as described above, the ZnS shell is characterized by shorter average bond lengths than in the CdSe core. In order to successfully form high quality composite structures, special precautions must be taken, e.g., doping of atoms from the core into the shell to relax the lattice in the shell and allow it to more easily match the lattice of the core. The use of these alloyed or mixed shells has been described in U.S. Pat. No. 6,815,064 to Treadway et al., assigned to Quantum Dot Corporation (Hayward, Calif.) and incorporated by reference herein.

Despite the significant commercial impact of the new engineered nanoparticle structures, there remain limitations in the field which have not yet been overcome. For example, it is now understood that many applications demand the ability to independently tune the size and the emission characteristics of the final nanoparticles rather than allowing them to move in lockstep. One example of this need is related to the fact that the efficiency of light absorption, and therefore the ultimate brightness, of the nanoparticle is a steep function of the particle size. It is desirable therefore in some applications requiring extremely sensitive detection to maximize the size of the nanoparticles without necessarily maximizing the emission wavelength for the resulting labels. Alternatively, some potential uses for quantum dots require them to be prepared as small as possible, particularly where steric or other physical constraints limit the size of the label which can be used (e.g., labeling inside the nuclei of living cells). Again, it is desirable to prepare a palette of colors for this application, but here smaller particles are more useful.

Another limitation which must be overcome is the fact that the cost of research associated with the development of high-quality inorganic passivating layers for nanoparticles is extremely high. Passivation is critical to most quantum dot applications, if not all applications requiring luminescent versions of the particles. For this reason, it is useful to make a single overcoating material (e.g., ZnCdS) serve for many distinct nanocrystal core compositions.

It has further proven difficult to engineer the peak emission wavelength of a luminescent semiconductor nanoparticle, e.g., to provide emission in the red to infrared regions of the spectrum, without increasing particle size.

Some attempts have been made to engineer the electronic and optical properties of luminescent semiconductor nanoparticles by doping nanoparticle cores with an additive. For instance, a method has been described for increasing peak emission wavelength by doping nanoparticle cores with a material capable of shifting the emission peak to the desired extent, but the resulting core-shell structures exhibit rapid degradation of optical properties. See, e.g., Zhong et al. (2003), "Composition-Tunable $Zn_xCd_{1-x}Se$ Nanocrystals with High Luminescence and Stability," *J. Am. Chem. Soc.* 125:8589-8594. This is in large part because the amount of dopant believed necessary to effect a significant change in peak emission wavelength was so high, and an introduction of a substantial amount of dopant changed the properties of the core adversely. For example, it has been disclosed that doping CdSe with Te at a level of at least 50% (such that the molar ratio of Te to Se in the $CdSe_{1-x}Te_x$ core is greater than 1:1) is necessary to provide a meaningful increase in peak emission wavelength. See Bailey et al. (2003), "Alloyed Semiconductor Quantum Dots: Tuning the Optical Properties without Changing the Particle Size," *J. Am. Chem. Soc.* 125:7100-7106.

There remains, accordingly, a need for a way to prepare luminescent nanoparticles in a manner that enables engineering of key electronic, optical, and physical properties, e.g., bandgap energy, brightness, peak emission wavelength, chemical stability, and photochemical stability, without necessarily increasing particle size or significantly changing the composition of the nanoparticle core. Such a method would be highly valuable in many contexts, for example enabling preparation of bright, stable particles emitting in a longer wavelength region—e.g., in the red to infrared regions of the electromagnetic spectrum.

SUMMARY OF THE INVENTION

The invention is addressed to the aforementioned need in the art, and provides a way to engineer the electronic and optical properties of a luminescent semiconductor nanoparticle without increasing particle size or adversely affecting key properties of the nanoparticle, particularly brightness, chemical stability, and photochemical stability. The invention is premised on the discovery that the electronic and optical properties of a luminescent semiconductor nanoparticle can be compositionally engineered, i.e., shifted by a change in composition rather than particle size, and that a relative small change in the composition of the nanoparticle core can give rise to a substantial shift in selected electronic and optical properties. For example, the invention provides a method for increasing the peak emission wavelength of a luminescent semiconductor nanoparticle without necessarily increasing particle size or adversely impacting on brightness or compatibility with a desired passivating overlayer, wherein (1) a significant wavelength shift results from a relatively small change in composition, and (2) the desired properties of the nanoparticle are retained.

The invention also provides a way to make a single overcoating material (e.g., ZnCdS) serve for many distinct nanocrystal core compositions. In addition to the direct savings in product development costs, additional utility is achieved when a common overcoating is employed among multiple core types because this results in a common platform for subsequent processing including solubilization and conjugation of the quantum dots to biological content. Finally, use of a common overcoating approach with several different core materials helps ensure relatively common sensitivities among the materials toward environmental factors such as pH and salt content; this is important when the materials are used together in multi-color applications.

The present invention enables additional advantages in several ways. First, a given emission wavelength can be achieved through a combination of size and composition tuning which breaks the absolute tie between particle size and emission wavelength and allows for the possibility of large and small particles with common emission maxima. Second, the fact that large changes in important properties such as emission wavelength, can be effected with very small compositional changes in (for example) chalcogenide content, means that an overcoating strategy used for the pure material is likely to be applicable to the lightly modified composition with little change in methodology. Specifically in one included example (infra), small amounts of tellurium have been added to an essentially pure CdSe core, resulting in a large emission maximum shift to the red. The highly optimized ZnCdS overcoating layer in commercial use with pure CdSe particles could be applied to lightly modified CdSeTe core with little change resulting in a particle with brightness and stability very similar to that of CdSe, but with emission maximum closer to that expected for CdTe.

While not wishing to bound by theory, at least two important mechanisms are probably at play in this example. Emphasis can first be placed on the idea of lattice match. In this case, it is the fact that the low levels of tellurium in the selenium matrix of CdSe probably have a negligible impact on the lattice properties of the core. It can be expected that the overcoating optimized to lattice match the pure CdSe core will also lattice match the ternary core. Emphasis can alternatively be placed on the electronic properties of the system. In this case it is the fact that the small amount of additional tellurium will have a large impact on those aspects of the particle electronics resulting in low energy emission, but not on those which typically pre-dispose telluride particles to oxidative chemical decomposition.

In a first embodiment, the invention provides a method for making a luminescent semiconductor nanoparticle $N_{XAB}$ composed of X, A, and B, wherein X, A, and B are different, and the nanoparticle has a peak emission wavelength longer than a nanoparticle $N_{XA}$ composed of X and A and longer than a nanoparticle $N_{XB}$ composed of X and B, wherein $N_{XA}$, $N_{XB}$, and $N_{XAB}$ are identically sized, the method comprising:

combining B with X and A in an amount such that the molar ratio B:(A+B) is in the range of approximately 0.01 to 0.10 and the molar ratio X:(A+B) is in the range of approximately 0.5:1.0 to 2:1, under reaction conditions effective to provide a nanoparticle.

In some contexts, it is desirable that a nanoparticle $N_{XAB}$ composed of X, A, and B exhibit some properties similar to those of an identically sized nanoparticle $N_{XA}$ composed of X, A, and no B, and other properties of an identically sized nanoparticle $N_{XB}$ composed of X, B, and no A. For example, an $N_{XA}$ nanoparticle contained within a particular passivating overlayer may exhibit excellent brightness, good chemical and photochemical stability, and breadth and efficiency of excitation, but emit at a wavelength shorter than that desired, while an $N_{XB}$ nanoparticle of identical size may have a longer peak emission wavelength but lack one or more of the other desirable properties, e.g., compatibility with the overlayer material. The invention enables the preparation of $N_{XAB}$ nanoparticles that retain desirable properties of $N_{XA}$, particularly with regard to the suitability of a particular passivating overlayer, but that have a peak emission wavelength closer to that of $N_{XB}$ than $N_{XA}$, without introduction of a significant amount of B. By a "suitable" passivating overlayer is meant an overlayer that is well matched to the core in terms of lattice structure and that is sufficiently protective (i.e., physically protective, protective of electronic properties, or both).

One application of the invention pertains to the preparation of luminescent nanoparticles emitting strongly in the red and infrared spectral regions. Long wavelength light in these regions of the electromagnetic spectrum is inefficiently scattered compared to bluer light. Less scatter is associated with deeper penetration of light into, or more facile escape of light from, turbid media such as biological tissues or bulk powders (e.g. barrels of chemicals which need to be quality controlled). Red-emitting materials have been difficult to synthesize and are not very common in nature; therefore, the environment (1) contributes a relatively small amount of background emission in this region of the spectrum, which is important for ultra-sensitive detection, and (2) absorbs very little emitted light in this region, which leads to relatively brighter signals from far-red or infrared emitters. For biological samples in particular, this region allows fluorescent detection with attenuated interference from water, blood, or intervening tissues such as skin.

Discrete size populations of cadmium telluride (CdTe) nanocrystals fluoresce across this red spectral range, but are chemically unstable. Protective inorganic overlayers including CdS and ZnS have been successfully applied to CdSe cores, but applying a sufficiently protective coating to CdTe, with its even longer bond lengths and higher conduction band energies, has not resulted in stable nanoparticles. The present invention now enables preparation of nanoparticles that can be lattice-matched to overlayer materials suitable for deposition on CdSe cores and maintain electronic properties favorable to passivation with overlayers useful with CdSe cores, but that, like CdTe, fluoresce in the redder spectral range. Addition of a small amount of tellurium to the synthesis of the underlying cadmium selenide cores according to the method of the invention results in unexpectedly large red shifts in the emission spectra for the composite materials. In fact, and as demonstrated in the examples, nanoparticles composed of a CdSe core and a CdZnS overlayer ("CdSe/CdZnS" nanoparticles) modified so as to include less than 5 mole percent of Te in the synthesis of the core exhibit a peak emission wavelength more than 100 nm outside of the conventional window for pure CdSe, and are bright, stable nanoparticles emitting in the red and infrared spectral ranges.

In a related embodiment, then, the invention provides a method for preparing a nanoparticle that exhibits emission in the red or infrared spectral range which comprises:

(a) combining a cadmium precursor, a selenium precursor, and a tellurium precursor in a solvent, wherein the mole ratio of tellurium to selenium is the range of about 0.01 to about 0.1;

(b) inducing formation of a nanoparticle core using a first accelerant;

(c) combining the nanoparticle core with a solvent, a sulfur precursor, a second accelerant, and a cadmium precursor, a zinc precursor, or both a cadmium precursor and a zinc precursor.

In another embodiment, the invention provides a luminescent semiconductor nanoparticle comprising a crystalline core and a protective, passivating overlayer, wherein:

the core comprises $Cd_aSe_bTe_c$ in which the ratio a:(b+c) is in the range of about 0.7 to about 1.5 and the ratio c:(b+c) is in the range of about 0.001 to about 0.2; and the overlayer layer comprises $Cd_xZn_yS_z$, wherein the ratio (x+y):z is in the range of about 0.7 to about 1.5.

In a further embodiment of the invention, a luminescent semiconductor nanoparticle $N_{XAB}$ is provided which comprises a first component X, a second component A, and a third component B, and exhibiting an increased peak emission wavelength relative to that of a luminescent semiconductor nanoparticle $N_{XA}$ of identical size and comprised of X, A, and no B, wherein:

(a) $N_{XAB}$ has a composition $XA_ZB_{1-Z}$ wherein Z is in the range of approximately 0.900 to 0.999; or Z is in the range of approximately 0.95 to 0.99;

(b) X is selected from Cd, Zn, Hg, Al, Ga, In, and A and B are selected from Se, Te, S, As, Sb, P, Pb, and Sn wherein (i) when X is Cd, Zn, or Hg, then A and B are selected from Se, Te, and S, and (ii) when X is Al, Ga, or In, then A and B are selected from As, Sb, P, Pb, and Sn; and (c) the increase in peak emission wavelength characterized by the relationship (1)

$$|(\lambda_{XAB} - \lambda c_{XA})| > |(\lambda_{XAB} - \lambda_{XB})| \qquad (1)$$

in which:

$\lambda_{XAB}$ is the peak emission wavelength of $N_{XAB}$;

$\lambda_{XA}$ is the peak emission wavelength of $N_{XA}$; and $\lambda_{XB}$ is the peak emission wavelength of a luminescent, semiconductor nanoparticle $N_{XB}$ composed of X, B, and no A, and having the same size as $N_{XAB}$ and $N_{XA}$.

DETAILED DESCRIPTION OF THE INVENTION

Figure 1:
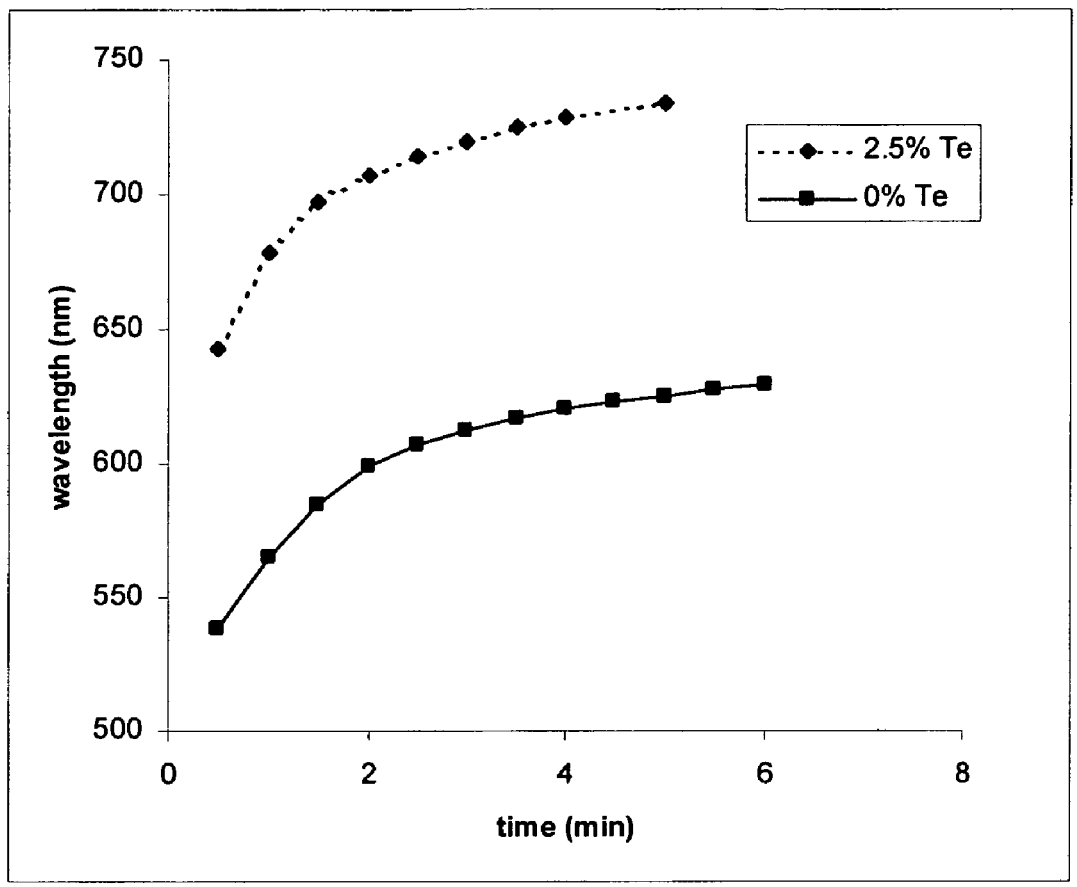
FIG. 1 is a graph illustrating the temporal evolution of peak emission wavelength over the course of typical nanocrystal core reactions. The two lines represent the growth curves for cores that have been grown with or without the addition to the synthesis of a small amount of tellurium, as described in Example 1.

Definitions and Overview:

It must be noted that, as used in this specification and the appended claims, the singular forms "a", "an" and "the" include plural referents unless the context clearly dictates otherwise. Thus, for example, reference to "a component" or "an element" refers to a single component or element as well as two or more components or elements, which may or may not be combined in an admixture.

In describing and claiming the present invention, the following terminology will be used in accordance with the definitions set out below.

The term "nanoparticle" refers to a particle, generally a semiconductive particle, having a diameter in the range of about 1-1000 nm, preferably in the range of about 2-50 nm, more preferably in the range of about 2-20 nm.

The terms "semiconductor nanoparticle" and "semiconductive nanoparticle" refer to a nanoparticle as defined herein, that is composed of an inorganic semiconductive material, an alloy or other mixture of inorganic semiconductive materials, an organic semiconductive material, or an inorganic or organic semiconductive core contained within one or more semiconductive overcoat layers.

The terms "semiconductor nanocrystal," "quantum dot" and "Qdot® nanocrystal" are used interchangeably herein to refer to semiconductor nanoparticles composed of an inorganic crystalline material that is luminescent (i.e., they are capable of emitting electromagnetic radiation upon excitation), and include an inner core of one or more first semiconductor materials that is optionally contained within an overlayer of a second inorganic material. The surrounding overlayer material will preferably have a bandgap energy that is larger than the bandgap energy of the core material and may be chosen to have an atomic lattice close to that of the core substrate. The "overlayer" material may be formed as an interfacial component of the core.

The term "solid solution" is used herein to refer to a compositional variation that is the result of the replacement of an atom or ion with another atom or ion, e.g., CdS in which some of the Cd atoms have been replaced with Zn. This is in contrast to a "mixture," a subset of which is an "alloy," which is used herein to refer to a class of matter with definite properties whose members are composed of two or more substances, each retaining its own identifying properties.

By "luminescence" is meant the process of emitting electromagnetic radiation (light) from an object. Luminescence results when a system undergoes a transition from an excited state to a lower energy state with a corresponding release of energy in the form of a photon. These energy states can be electronic, vibrational, rotational, or any combination thereof. The transition responsible for luminescence can be stimulated through the release of energy stored in the system chemically or added to the system from an external source. The external source of energy can be of a variety of types including chemical, thermal, electrical, magnetic, electromagnetic, and physical, or any other type of energy source capable of causing a system to be excited into a state higher in energy than the ground state. For example, a system can be excited by absorbing a photon of light, by being placed in an electrical field, or through a chemical oxidation-reduction reaction. The energy of the photons emitted during luminescence can be in a range from low-energy microwave radiation to high-energy X-ray radiation. Typically, luminescence refers to photons in the range from UV to IR radiation, and usually refers to visible electromagnetic radiation (i.e., light).

The term "monodisperse" refers to a population of particles (e.g., a colloidal system) wherein the particles have substantially identical size and shape. For the purpose of the present invention, a "monodisperse" population of particles means that at least about 60% of the particles, preferably about 75-90% of the particles, fall within a specified particle size range. A population of monodisperse particles deviates less than 10% rms (root-mean-square) in diameter and preferably less than 5% rms.

The phrase "one or more sizes of nanoparticles" is used synonymously with the phrase "one or more particle size distributions of nanoparticles." One of ordinary skill in the art will realize that particular sizes of nanoparticles such as semiconductor nanocrystals are actually obtained as particle size distributions.

By use of the term "narrow wavelength band" or "narrow spectral linewidth" with regard to the electromagnetic radiation emission of the semiconductor nanocrystal is meant a wavelength band of emissions not exceeding about 60 nm, and preferably not exceeding about 30 nm in width, more preferably not exceeding about 20 nm in width, and symmetric about the center. It should be noted that the bandwidths referred to are determined from measurement of the full width of the emissions at half peak height (FWHM), and are appropriate in the emission range of 200-2000 nm.

By use of the term "a broad wavelength band," with regard to the excitation of the semiconductor nanocrystal is meant absorption of radiation having a wavelength equal to, or shorter than, the wavelength of the onset radiation (the onset radiation is understood to be the longest wavelength (lowest energy) radiation capable of being absorbed by the semiconductor nanocrystal). This onset occurs near to, but at slightly higher energy than the "narrow wavelength band" of the emission. This is in contrast to the "narrow absorption band" of dye molecules, which occurs near the emission peak on the high energy side, but drops off rapidly away from that wavelength and is often negligible at wavelengths further than 100 nm from the emission.

The terms "emission peak" and "peak emission wavelength" are used interchangeably to refer to the wavelength of light within the characteristic emission spectra exhibited by a particular semiconductor nanocrystal size distribution that demonstrates the highest relative intensity.

The term "alkyl" as used herein refers to a branched or unbranched saturated hydrocarbon group of 1 to approximately 24 carbon atoms, such as methyl, ethyl, n-propyl, isopropyl, n-butyl, isobutyl, t-butyl, octyl, decyl, tetradecyl, hexadecyl, eicosyl and tetracosyl, as well as cycloalkyl groups such as cyclopentyl and cyclohexyl. Similarly, alkanes are saturated hydrocarbon compounds such as methane, ethane, and so forth. The term "lower alkyl" is intended to mean an alkyl group of 1 to 4 carbon atoms, and thus includes methyl, ethyl, n-propyl, isopropyl, n-butyl, isobutyl and t-butyl.

The term "alkene" as used herein refers to a branched or unbranched hydrocarbon compound typically although not necessarily containing 2 to about 29 carbon atoms and at least one double bond, such as ethylene, n-propylene, isopropylene, butene, butylene, propylene, octene, decylene, and the like. Generally, although not necessarily, the alkenes used herein contain 2 to about 29 carbon atoms, preferably about 8 to about 20 carbon atoms. The term "lower alkene" is intended to mean an alkene of 2 to 4 carbon atoms.

The term "alkyne" as used herein refers to a branched or unbranched hydrocarbon group typically although not necessarily containing 2 to about 24 carbon atoms and at least one triple bond, such as acetylene, allylene, ethyl acetylene, octynyl, decynyl, and the like. Generally, although again not necessarily, the alkynes used herein contain 2 to about 12 carbon atoms. The term "lower alkyne" intends an alkyne of 2 to 4 carbon atoms, preferably 3 or 4 carbon atoms.

The semiconductor nanoparticles of the invention are particles composed of a semiconductive material and having a diameter in the range of approximately 1 nm to 1000 nm, generally in the range of approximately 1 to 50 nm, and optimally in the range of approximately 2 to 20 nm. The semiconductive material is an inorganic, crystalline material that includes at least three elements, which, in the formation of the nanoparticle, may be combined as individual elements and/or as alloys or other mixtures as will be discussed in further detail below. The semiconductor nanoparticles of the invention all exhibit luminescence. As is well understood in the art, luminescence results when a system undergoes a transition from an excited state to a lower energy state with a corresponding release of energy in the form of a photon. These energy states can be electronic, vibrational, rotational, or any combination thereof. The transition responsible for luminescence can be stimulated through the release of energy stored in the system chemically or added to the system from an external source. The external source of energy can be of a variety of types including chemical, thermal, electrical, magnetic, electromagnetic, and physical, or any other type of energy source capable of causing a system to be excited into a state higher in energy than the ground state. For example, a system can be excited by absorbing a photon of light, by being placed in an electrical field, or through a chemical oxidation-reduction reaction. The energy of the photons emitted during luminescence can range from low energy microwave radiation to high energy x-rays; luminescence in the present context refers to emission in the visible and infrared spectral regions. To ensure chemical and photochemical stability, enhance brightness, and provide physical protection of the nanoparticle, the nanoparticle itself, in most contexts, is contained within a suitable passivating overlayer. In contrast to the semiconductive core, the material used for the passivating layer has to be electronically insulating while nevertheless sufficiently "matched" in lattice structure to the core surface to remain intimately wed thereto. In addition, as discussed infra and in U.S. Pat. No. 6,815,064 to Treadway et al., it is desirable for the overlayer material to be used to dope the core material, and vice versa, in the region of the core/overlayer interface.

In a first embodiment, the invention provides a method for making a luminescent semiconductor nanoparticle $N_{XAB}$ composed of X, A, and B, wherein X, A, and B are different, wherein the nanoparticle has a peak emission wavelength longer than that of a nanoparticle $N_{XA}$ composed of X and A (and no B) and longer than that of a nanoparticle $N_{XB}$ composed of X and B (and no A), wherein $N_{XA}$, $N_{XB}$, and $N_{XAB}$ are identically sized. For instance, when X is Cd, A is Se, and B is Te, the nanoparticle $N_{XAB}$ has a peak emission wavelength greater than that of either CdSe or CdTe. The method involves combining B with X and A, in amounts such that the molar ratio B:(A+B) is in the range of approximately 0.01 to 0.10 and the molar ratio X:(A+B) is in the range of approximately 0.5:1.0 to 2:1, under reaction conditions effective to provide a nanoparticle. In a preferred embodiment, the molar ratio B:(A+B) is in the range of approximately 0.01 to 0.05, and the ratio X:(A+B) is approximately 1:1.

Many inorganic materials are suitable herein, and the invention is not limited in this regard. In one embodiment, by way of example, X is a Group 12 element, A is a Group 16 element, and B is an element selected from Groups 12, 13, 14, 15, and 16, with all group numbers referring to the IUPAC notation system for numbering element groups, as set forth in the Handbook of Chemistry and Physics, 81$^{st}$ Edition (CRC Press, 2000). In this embodiment, X is Cd, Zn, or Hg, and A and B are preferably selected from Se, Te, and S. For instance, as noted above, X may be Cd, A may be Se, and B may be Te, such that XA is CdSe, XB is CdTe, and $N_{XAB}$ comprises Cd, Se, and Te. In another embodiment, X is a Group 13 element and A is a Group 15 element. In this embodiment, X is preferably Al, Ga, or In, and A and B are selected from As, Sb, and P.

One advantage of the present invention is that it is possible to engineer the peak emission wavelength without increasing nanoparticle size or changing the composition significantly. That is, the amount of B incorporated in the aforementioned method represents at most 10 mole %, preferably at most 5 mole %, of the combined quantities of A and B. Yet, while the peak emission wavelength $\lambda_{XA}$ of a nanoparticle composed of X, A, and no B may be shorter than the peak emission wavelength $\lambda_{XB}$ of a identically sized nanoparticle composed of X, B, and no A, the peak emission wavelength of an identically sized $N_{XAB}$ nanoparticle may actually be longer than $\lambda_{XB}$. By "identically sized" is meant that the nanoparticles have essentially the same diameter. If desired, however, the peak emission wavelength $\lambda_{XAB}$ of $N_{XAB}$ may be engineered to be shorter than the peak emission wavelength $\lambda_{XB}$ of an identically sized nanoparticle $N_{XB}$. Generally, although not necessarily, the difference between $\lambda_{XAB}$ and $\lambda_{XB}$ will be less than the difference between $\lambda_{XAB}$ and $\lambda_{XA}$.

In certain embodiments, the peak emission wavelength $\lambda_{XAB}$ of $N_{XAB}$ is at least 50 nm longer than the peak emission wavelength $\lambda_{XA}$ of a nanoparticle $N_{XA}$ composed of X, A, and no B. For $N_{XAB}$ prepared so as to have a peak emission wavelength shifted toward the red to infrared regions of the electromagnetic spectrum, $\lambda_{XAB}$ is greater than 600 nm, preferably greater than 650 nm. In Example 1, for instance, incorporating 2.5 mole % Te into CdSe nanoparticle cores having a particle diameter of approximately 5 nm results in a shift in wavelength from about 630 nm to about 734 nm.

In combining B with X and A to form the nanoparticles $N_{XAB}$, B, X, and A may take the form of the individual elements, but more typically will comprise forms of those elements that essentially serve as precursors. For example, when X is Cd, the compound employed in the aforementioned method may be an organometallic compound such as $Cd(CH_3)_2$, an oxide such as CdO, a halogenated compound such as $CdCl_2$, or cadmium salts such as cadmium acetate, cadmium acetoacetonate, and cadmium nitrate. Similarly, the compounds providing A and B are normally in the tri-n-alkylphosphine adducts such as tri-n-(butylphosphine)selenide (TBP-Se) and tri-n-(octylphosphine)selenide (TOP-Se), hydrogenated compounds such as $H_2Se$, silyl compounds such as bis(trimethylsilyl)selenium ($(TMS)_2Se$), and metal salts such as NaHSe. These are typically formed by combining a desired element, such as Se, with an appropriate coordinating solvent, e.g., tri-n-octylphosphine (TOP). Other exemplary organic precursors are described in U.S. Pat. Nos. 6,207,299 and 6,322,901 to Bawendi et al., and synthetic methods using weak acids as precursor materials are disclosed by Qu et al., (2001) "Alternative Routes toward High Quality CdSe Nanocrystals," *Nano Lett.*, 1(6):333-337, the disclosures of which are incorporated herein by reference. Thus, suitable chemical compounds, or "precursors," for introducing and combining X, A, and B in a reaction mixture include, but are not limited to, Group 16 elements; trialkylphosphines of Group 16 elements (such as tri-n-butylphosphine-substituted Se); bis-trialk-ylsilyl-substituted Group 16 elements (such as bis(trimethylsilyl)selenide); Groups 12, 13, and 14 metals and metal salts of acids, such as nitrates, acetates and carbonates; Groups 12, 13, and 14 metal oxides; and $C_1$-$C_4$ alkyl-substituted Groups 12, 13, and 14 metals. Exemplary non-organometallic precursors and synthetic methods using such precursors are described in U.S. Pat. No. 6,576,291 to Bawendi et al.

The reaction used to prepare $N_{XAB}$ nanoparticles is carried out in a coordinating solvent, optionally diluted with an essentially non-coordinating solvent (e.g., an alkane). Suitable coordinating reaction solvents include, by way of illustration and not limitation, amines, phosphines, phosphine oxides, alkenes, alkynes, fatty acids, ethers, furans, pyridines, and combinations thereof (in the latter case, the reaction solvent termed a "solvent system"). Examples of representative solvents are as follows: (a) amine solvents—alkylamines such as dodecylamine and hexyldecylamine; (b) phosphines—alkyl phosphines, particularly trialkyl phosphines such as tri-n-TBP and TOP; (c) phosphine oxides—alkyl phosphine oxides, particularly trialkyl phosphine oxides such as tri-n-octylphosphine oxide (TOPO); fatty acids—stearic and lauric acids; ethers and furans—tetrahydrofuran and its methylated forms, glymes; phosphoacids—hexylphosphonic acid, tetradecylphosphonic acid, and octylphosphinic acid, preferably used in combination with an alkyl phosphine oxide such as TOPO; and pyridines—pyridine per se, alkylated pyridines, nicotinic acid, etc. Coordinating solvents can be used alone or in combination. TOP-TOPO solvent systems are commonly utilized in the art, as are other related (e.g., butyl) systems. For example, TOP and TOPO can be used in combination to form a cadmium solution, while TOP, alone, can be used to form a selenium solution.

Technical grade coordinating solvents can be used, and benefits can be obtained from the existence of beneficial impurities in such solvents, e.g. TOP, TOPO or both. However, in one preferred embodiment, the coordinating solvent is pure. Typically this means that the coordinating solvent contains less than 10 vol. %, and more preferably less than 5 vol. % of impurities that can function as reductants. Therefore, solvents such as TOPO at 90% or 97% purity and TOP at 90% purity are particularly well suited for use in the methods of the invention.

The method used to prepare $N_{XAB}$ nanoparticles may be carried out in the presence of an accelerant, either heat, a chemical reaction promoter (as described in U.S. Patent Publication No. U.S. 2003/0097976 A1 to Zehnder et al., of common assignment herewith), or both in order to increase the rate of reaction. As described in the aforementioned patent publication, the reaction promoter can be an oxygen source or a reducing agent. Phosphine-based reductants are a preferred class of reducing agents. Non-phosphine, non-ligating chemical reductants such as hydroquinone, however, are also suitable. Illustrative reducing agents useful in conjunction with the present method include tertiary, secondary, and primary phosphines (e.g., diphenylphosphine, dicyclohexylphosphine, and dioctylphosphine), amines (e.g., decylamine and hexadecylamine), hydrazines, hydroxyphenyl compounds (e.g., hydroquinone and phenol), hydrogen, hydrides (e.g., sodium borohydride, sodium hydride and lithium aluminum hydride), metals (e.g., mercury and potassium), boranes (e.g., THF:$BH_3$ and $B_2H_6$), aldehydes (e.g., benzaldehyde and butyraldehyde), alcohols and thiols (e.g., ethanol and thioethanol), reducing halides (e.g., $I^-$ and $I_3^-$), polyfunctional reductant versions of these species (e.g., a single chemical species that contains more than one reductant moiety, each reductant moiety having the same or different reducing capacity, such as tris(hydroxypropyl)phosphine and ethanolamine), and so forth. In the preferred embodiment herein, wherein the nanoparticle core and passivating overlayer comprise Cd, Zn, Se, Te, or S, reducing agent should, correspondingly, be capable of reducing cadmium(II), zinc(II), selenium (0), tellurium(0), or sulfur(0).

As discussed above, the present nanoparticles are generally provided with a passivating overlayer wed to the nanoparticle surface with an interfacial region formed at the juncture of the nanoparticle and the overlayer. The protective, passivating overlayer can comprise a semiconductive material having a band gap energy greater than that of $N_{XAB}$. The interfacial region may be discontinuous, comprise a monolayer, or comprise many monolayers, and the region may incorporate several combinations of elements. For example, in a nanocrystal with a CdSe core and a ZnS overlayer, the interfacial region might include the combinations Cd/Zn/S, Cd/Se/Zn, or even Cd/Se/Zn/S. The region may also contain elements not native to either the core or overlayer structures. For example in the CdSe/ZnS/Cd case, small numbers of oxygen atoms might be introduced into the interfacial region during synthesis. Other elements that may be used as additives include Fe, Nb, Cr, Mn, Co, Cu, and Ni. There may also be a solid solution gradient in which, for example, in a CdSe/ZnS nanoparticle, the passivating overlayer contains mostly Zn and S at its exterior surface with some Cd and Se gradually introduced as the distance to the nanoparticle core decreases; the same solid solution gradient can be introduced into the nanoparticle core, with increased amounts of Zn and S present as the distance to the core surface decreases.

In a preferred embodiment, the interfacial region is in the form of a solid solution with a gradient as just described, wherein the region is comprised of some or all of the chemical elements from the passivating overlayer and the core, and may also include an additive as described in commonly assigned U.S. Pat. No. 6,815,064 to Treadway et al., previously cited and incorporated by reference herein. Conveniently, in this embodiment, the method is carried out as a one-pot synthesis, as described in the aforementioned patent. In this method, the nanoparticle cores are prepared as described above, but are not isolated immediately; rather, a selected additive is added to the solution containing the cores, along with precursors to the elements that will form the passivating overlayer. The additive is generally comprised of a material selected from Groups 2, 12, 13, 14, 15, and 16, and may also be found in the nanoparticle core. Further detail concerning the synthesis of nanoparticles in this way may be found in the aforementioned patent to Treadway et al.

The passivating overlayer of the luminescent nanoparticles may be covered with an organic or other outer layer. The outer layer may be comprised of materials selected to provide compatibility with a suspension medium, such as a short-chain polymer terminating in a moiety having affinity for a suspending medium, or with a moiety that possesses affinity for a particular surface. Common materials suitable for the outer layers include, but are not limited to, polystyrene, polyacrylate, polyimide, polyacrylamide, polyethylene, poly(phenylenevinylene), polypeptides, polysaccharides, polysulfone, polypyrrole, polyimidazole, polythiophene, polyether, epoxies, silica glass, silica gel, titania, siloxanes, polyphosphate, hydrogels, agarose, celluloses, and the like. The coating can be in the range of about 2 to 100 nm thick, preferably 2 to 10 nm thick.

It is important to note that the nanoparticles exhibit high quantum yields upon dispersion in a solvent system, with the quantum yield quite stable over time and as a function of material handling. Many common uses of quantum dots require dispersion in aqueous solvent systems, in turn requiring surface modification of oil-dispersible quantum dots to enable dispersion in aqueous media. U.S. Pat. No. 6,649,139 to Adams et al., incorporated by reference herein, describes an optimal surface modification method in which mixed hydrophobic/hydrophilic polymer transfer agents are bound to the surface of the quantum dots. The nanoparticles of the present invention exhibit a high, stable quantum yield not only in a dispersion in an organic solvent system but also in an aqueous dispersion. As indicated in the example, the nanoparticles of the invention not only become much brighter initially as a function of small decreases in the amount of added tellurium ("B"), but they also maintain this brightness even after dispersal in water. In general, the quantum yield for a dispersion of $N_{XAB}$ nanoparticles in either an organic solvent system or an aqueous solvent system is greater than 0.10, preferably greater than 0.40, and most preferably greater than 0.80.

In a related embodiment, the invention provides a method for preparing a nanoparticle that exhibits emission in the red or infrared spectral range by: combining a cadmium precursor, a selenium precursor, and a tellurium precursor in a solvent, wherein the mole ratio of tellurium to selenium is the range of about 0.01 to about 0.10, preferably in the range of about 0.01 to about 0.05; inducing formation of a nanoparticle core using a first accelerant; optionally isolating the nanoparticle core; and combining the nanoparticle core with a solvent, a sulfur precursor, a second accelerant, and a cadmium precursor, a zinc precursor, or both a cadmium precursor and a zinc precursor. Cadmium precursors, selenium precursors, and tellurium precursors are as described above, and a preferred solvent is a phosphine, a phosphine oxide, an alkene, an alkyne, an amine, or a combination thereof, with representative such solvents described hereinabove. In one embodiment, at least one of the first accelerant and the second accelerant is heat, and in another embodiment at least one of the first accelerant and the second accelerant is a chemical promoter, i.e., an oxygen source or a reducing agent, as described above. In a particularly preferred embodiment, a chemical promoter is combined with heat, and the reaction is carried out in the presence of a phosphonic acid, a phosphinic acid, a carboxylic acid, a sulfonic acid, or a combination thereof.

In a further embodiment, a luminescent semiconductor nanoparticle is provided that comprises a crystalline core and a protective, passivating overlayer, wherein the core comprises $Cd_aSe_bTe_c$ in which the ratio a:(b+c) is in the range of about 0.7 to about 1.5 and the ratio c:(b+c) is in the range of about 0.001 to about 0.20, and the overlayer comprises $Cd_xZn_yS_z$, wherein the ratio (x+y):z is in the range of about 0.7 to about 1.5 and x or y may be zero. The overlayer may further comprise Se and/or Te, and the Se and Te may be distributed throughout the core, or may be present in distinct regions within the core. The emission quantum yield of an aqueous dispersion of these particles, prepared according to the method of U.S. Pat. No. 6,649,139 to Adams et al., cited above, is at least 0.1, preferably at least 0.4, and most preferably at least 0.8.

It is to be understood that while the invention has been described in conjunction with specific embodiments thereof, the foregoing description as well as the examples that follow are intended to illustrate and not limit the scope of the invention. Other aspects, advantages, and modifications within the scope of the invention will be apparent to those skilled in the art to which the invention pertains. All patents, patent applications, patent publications, journal articles, and other references cited herein are incorporated by reference in their entireties.

Experimental:

The following examples are put forth so as to provide those of ordinary skill in the art with a complete disclosure and description of how to carry out the method of the invention and make the present nanoparticles. Efforts have been made to ensure accuracy with respect to numbers (e.g., amounts, temperature, etc.) but some experimental error and deviations should, of course, be allowed for. Unless indicated otherwise, parts are parts by weight, temperature is in degrees centigrade and pressure is at or near atmospheric.

Materials: In the following examples, materials were obtained as follows: tetradecylphosphonic acid (TDPA, 98%), selenium shot (99.999%), and tellurium shot (99.9999%), from Alfa; tri-n-octylphosphine oxide (TOPO, 99%), tri-n-octylphosphine (TOP, 97%), diethylzinc (100%), and anhydrous cadmium acetate, from Strem; diphenylphosphine, from Aldrich; and hexmethyldisilthiane, from Fluka.

EXAMPLE 1

Synthesis of mixed cadmium, selenium, tellurium nanocrystalline cores:

TDPA (0.549 g), TOPO (6.000 g), and a magnetic stir bar were added to a clean, dry 50 mL three-neck round bottom flask. Port 1 of the flask was equipped with a gas inlet adapter to allow for evacuation and nitrogen refill, port 2 was equipped with a temperature probe attached to a temperature control device, and port 3 was fitted with a rubber septum. The flask was evacuated, refilled with nitrogen gas, and maintained under a nitrogen blanket. TOP (3.6 μL) and 1.972 g of Cd-TOP solution (containing cadmium acetate dissolved in TOP at a concentration of 0.5 moles of cadmium per kg solution) were added. A needle was inserted into the septum on port 3. The mixture was heated to 260° C. and held at that temperature for 20 minutes. The needle was removed and the reaction flask was heated to 355° C. During this heating step, diphenylphosphine (0.030 mL) was added, and at 340° C., a solution of 0.035 mL of TOP-Te (1M tellurium shot in TOP) and 1.346 mL of TOP-Se (1M selenium shot in TOP) was added. Aliquots were removed every 30 seconds to determine the current emission maximum. The reaction was halted by addition of 4.0 mL of room-temperature TOP.

A graph of the peak emission wavelength obtained versus time is shown in FIG. 1. The second curve, identified in the figure as "0% Te," corresponds to cores prepared in a manner identical to that just described, but wherein the TOP-Te is replaced with an equivalent molar amount of TOP-Se. As may be seen in the graph, the introduction of Te into the CdSe core at a level approximately 2.5 mole % (i.e., Te/(Se+Te)=0.025) resulted in an increase in peak emission wavelength of approximately 100 nm.

Figure 2:
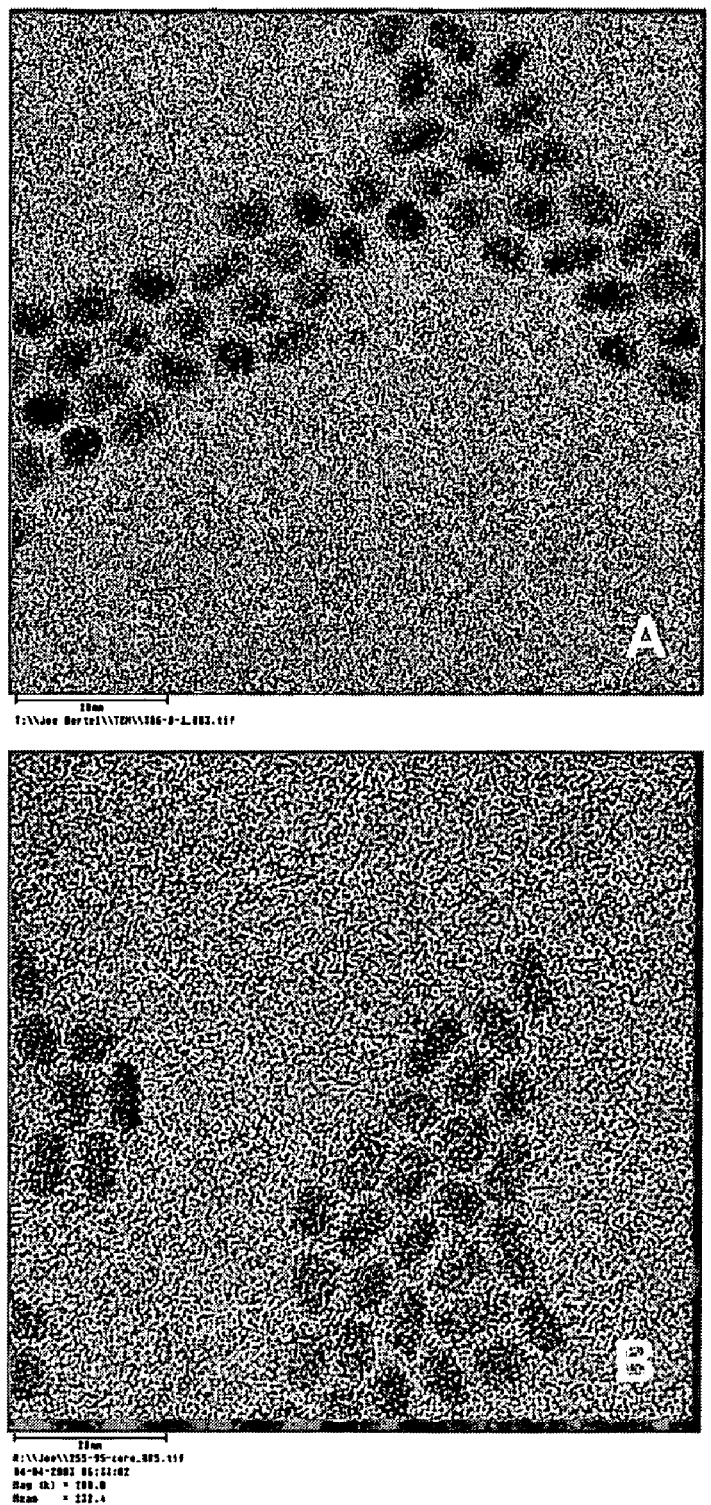
FIG. 2 shows the transmission electron micrographs obtained on cores prepared in the absence of tellurium (FIG. 2A) or with 2.5 mole % tellurium (FIG. 2B). As may be seen, the CdSeTe cores in FIG. 2B are of comparably size as or even smaller than the CdSe cores in FIG. 2A, in spite of the fact that the CdSeTe cores exhibit a peak emission wavelength of 734 nm, compared with an emission maximum of 630 nm from the CdSe cores.

FIG. 2 provides transmission electron micrographs (TEMs) obtained on cores prepared in the presence of either no tellurium (FIG. 2A) or 2.5 mole % tellurium (FIG. 2B). As may be seen, the CdSeTe cores in FIG. 2B are of comparable size as or even smaller than the CdSe cores in FIG. 2A, in spite of the fact that the CdSeTe cores exhibit a final peak emission wavelength of 734 nm, compared with a final emission maximum of 630 nm from the CdSe cores.

EXAMPLE 2

Synthesis of mixed cadmium, selenium, tellurium nanocrystalline cores with passivating overlayer:

TOPO (3.383 g) and a magnetic stir bar were added to a 50 mL three-neck round bottom flask. Ports 1, 2, and 3 were capped as described in Example 1. The flask was evacuated and refilled with nitrogen gas. Under vacuum and with constant stirring, the TOPO was heated to 180° C. for 1 hour. The flask was refilled with nitrogen gas and allowed to cool to 100° C. before TOP (3.4 mL) was added. Ethanol (21.3 mL) and a sample of the cores prepared in Example 1 (10.7 mL warmed to 50° C.) were added to a 60 mL centrifuge tube. The mixture was centrifuged, the supernatant was discarded, and the pellet was redispersed in hexanes. The dispersion was then added to the reaction flask at 100° C. A vacuum was applied to remove the hexanes leaving the nanocrystals dispersed in TOPO and TOP. Decylamine (2.8 mL) was added to the reaction flask. In a second flask, a mixture of 3.905 g of Cd-TOP solution described in Example 1, TDPA (2.730 g), and TOP (2.7 mL) were momentarily heated to 250° C. and then cooled to 100° C. under a nitrogen atmosphere. After 45 minutes, 2.5 mL of the cadmium acetate/TDPA/TOP solution was added to the cores. The reaction flask was heated to 230° C. and 3.9 mL of a solution containing TOP (2.926 g), diethylzinc (0.187 g), and hexamethyldisilthiane (0.203 g) was added drop-wise over a period of three hours. Aliquots were withdrawn from the reaction periodically to track the emission properties.

Figure 3:
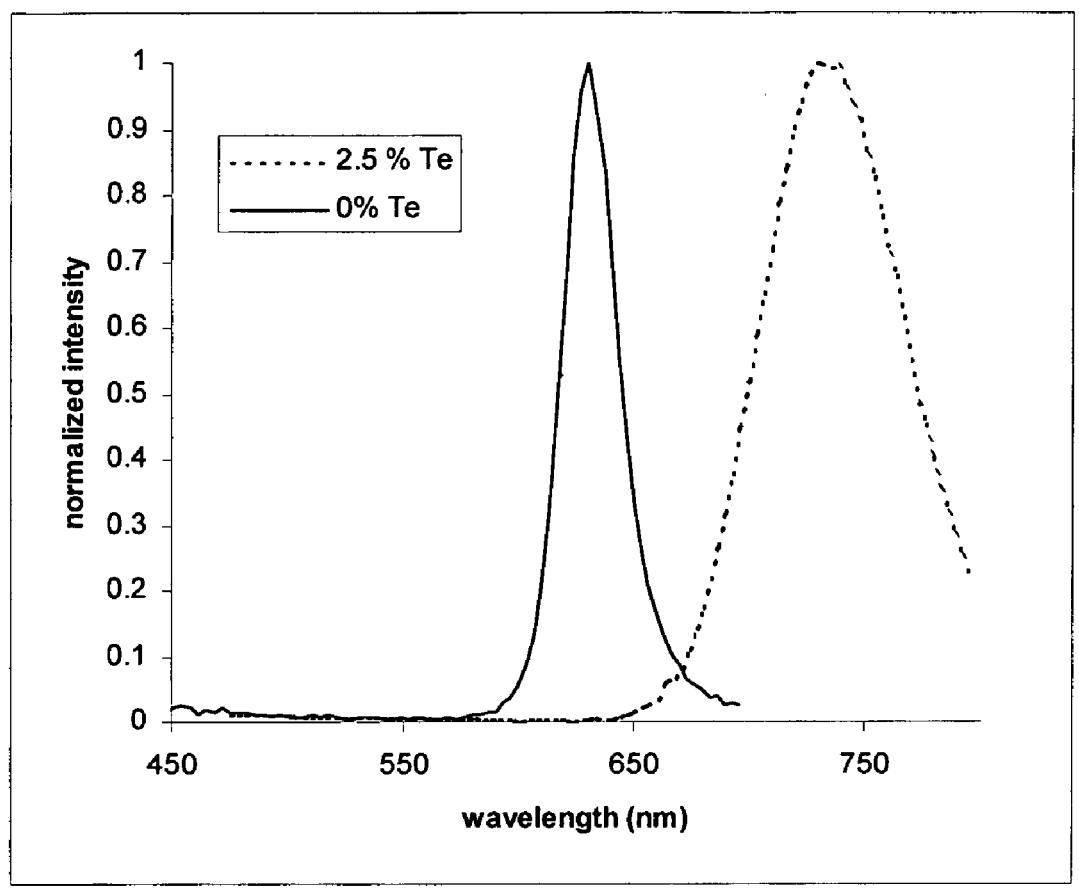
FIG. 3 shows the final emission spectra obtained for an overlayered core structure produced from cores containing 0% or 2.5% added tellurium, as described in Example 2.

The final emission spectrum obtained for these "core/overlayer" structures is shown in FIG. 3. The second spectrum shown corresponds to that obtained for the "0% Te" nanoparticle cores (described in Example 1) provided with a passivating overlayer as described above.

Figure 4:
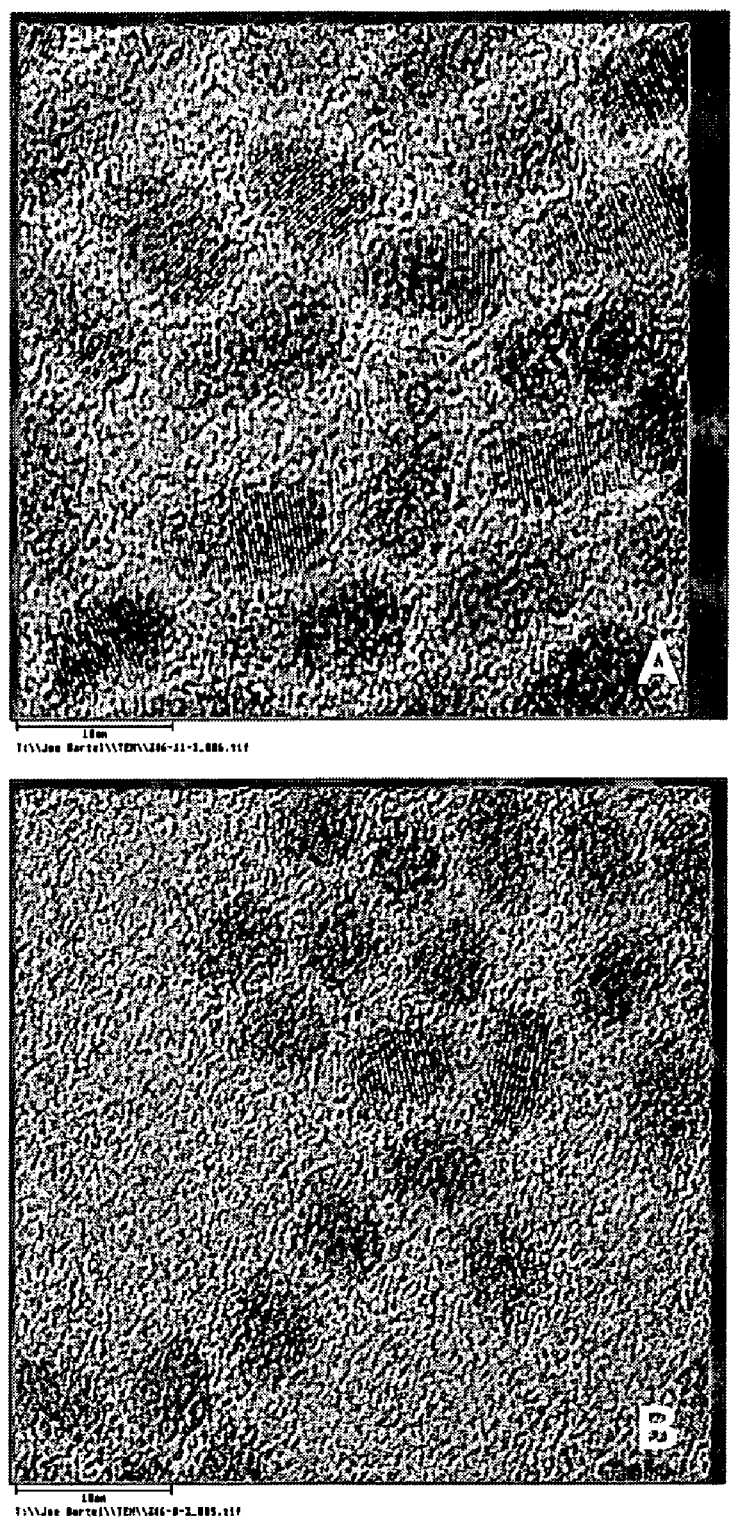
FIG. 4 shows transmission electron micrographs obtained for the cores prepared in Example 1, with 2.5 mole % tellurium, and for the corresponding overlayered core structures prepared in Example 2.

Additionally, it was found that when only small amounts of tellurium were needed to effect a substantial wavelength shift, extremely thick, high quality shells could still be grown atop the cores. This result is illustrated in FIG. 4, which provides transmission electron micrographs obtained for the cores prepared in Example 1, with 2.5 mole % tellurium (FIG. 4A), and for the corresponding "core/overlayer" structures prepared in Example 2 (FIG. 4B).

EXAMPLE 3

Evaluation of Quantum Yield:

The nanoparticles prepared in Example 2 were modified as described in U.S. Pat. No. 6,649,139 to Adams et al. to prepare the particles for dispersal in an aqueous solvent system, as follows.

(a) Synthesis of hydrophobically modified hydrophilic polymers for attachment to the nanoparticle surface:

A modified polyacrylic acid was prepared by diluting 100 g [0.48 mol COONa] of poly(acrylic acid, sodium salt) (obtained from Aldrich, molecular weight 1200) two-fold in water and acidifying in a 1.0 L round bottom flask with 150 ml (1.9 mol) of concentrated HCl. The acidified polymer solution was concentrated to dryness on a rotary evaporator (100 mbar, 80° C.). The dry polymer was evacuated for 12 hours at <10 mbar to ensure water removal. A stirbar and 47.0 g (0.24 mol) of 1-[3-(dimethyl-amino)-propyl]-ethylcarbodiimide hydrochloride (EDC-Aldrich 98%) were added to the flask, and the flask was then sealed and purged with $N_2$, and fit with a balloon. 500 ml of anhydrous N,N-dimethylformamide (Aldrich) was transferred under positive pressure through a cannula to this mixture; and the flask was swirled gently to dissolve the solids. 32 ml (0.19 mol) of octylamine was transferred dropwise under positive pressure through a cannula from a sealed oven-dried graduated cylinder into the stirring polymer/EDC solution, and the stirring continued for 12 hours. This solution was concentrated to <100 ml on a rotary evaporator (30 mbar, 80° C.), and the polymer was precipitated by addition of 200 ml di-$H_2O$ to the cooled concentrate, which produced a gummy white material. This material was separated from the supernatant and triturated with 100 ml di-$H_2O$ three more times. The product was dissolved into 400 ml ethyl acetate (Aldrich) with gentle heating, and basified with 200 ml di-$H_2O$ and 100 g N-N-N-N-tetramethylammonium hydroxide pentahydrate (0.55 mo) for 12 hours. The aqueous layer was removed and precipitated to a gummy white product with 400 ml of 1.27 M HCl. The product was decanted and triturated with 100 ml of di-$H_2O$ twice more, after which the aqueous washings were back-extracted into 6×100 ml portions of ethyl acetate. These ethyl acetate solutions were added to the product flask, and concentrated to dryness (100 mbar, 60° C.). The crude polymer was dissolved in 300 ml of methanol and purified in two aliquots over LH-20 (Amersham-Pharmacia-5.5 cm×60 cm column) at a 3 ml/minute flow rate. Fractions were tested by NMR for purity, and the pure fractions were pooled, while the impure fractions were re-purified on the LH-20 column. After pooling all of the pure fractions, the polymer solution was concentrated by rotary evaporation to dryness, and evacuated for 12 hours at <10 mbar. The product was a white powder (25.5 g, 45% of theoretical yield), which showed broad NMR peaks in $CD_3OD$ [δ=3.1 b (9.4), 2.3 b (9.7), 1.9 1.7 1.5 1.3 b (63.3) 0.9 bt (11.3)], and clear IR signal for both carboxylic acid (1712 $cm^{-1}$) and amide groups (1626 $cm^{-1}$, 1544 $cm^{-1}$).

(b) Preparation of surface-modified nanocrystals:

Twenty milliliters of 3-5 μM (3-5 nmoles) of TOPO/TOP coated nanoparticles, prepared in Example 2, were precipitated with 20 milliliters of methanol. The flocculate was centrifuged at 3000×g for 3 minutes to form a pellet of the nanocrystals. The supernatant was thereafter removed and 20 milliliters of methanol was again added to the particles. The particles were vortexed to loosely disperse the flocculate throughout the methanol. The flocculate was centrifuged an additional time to form a pellet of the nanocrystals. This precipitation/centrifugation step was repeated an additional time to remove any excess reactants remaining from the nanocrystal synthesis. Twenty milliliters of chloroform were added to the nanocrystal pellet to yield a freely dispersed sol.

300 milligrams of the hydrophobically modified poly (acrylic acid) was dissolved in 20 ml of chloroform. Tetrabutylammonium hydroxide (1.0 M in methanol) was added to the polymer solution to raise the solution to pH 10 (pH was measured by spotting a small aliquot of the chloroform solution on pH paper, evaporating the solvent and thereafter wetting the pH paper with distilled water). Thereafter the polymer solution was added to 20 ml of chloroform in a 250 ml round bottom flask equipped with a stir bar. The solution was stirred for 1 minute to ensure complete admixture of the polymer solution. With continued stirring the washed nanocrystal dispersion described above was added dropwise to the polymer solution. The dispersion was then stirred for two minutes to ensure complete mixing of the components and thereafter the chloroform was removed in vacuo with low heat to yield a thin film of the particle-polymer complex on the wall of the flask. Twenty milliliters of distilled water were added to the flask and swirled along the walls of the flask to aid in dispersing the particles in the aqueous medium. The dispersion was then allowed to stir overnight at room temperature. At this point the nanocrystals were freely dispersed in the aqueous medium.

Additional nanoparticles were prepared as in Example 2, but with differing amounts of added tellurium: 1%, 5%, 10%, and 100% (mole percent relative to the combined amounts of Se and Te). The quantum yield of each nanoparticle was evaluated before and after dispersal in an aqueous solvent system. The results are shown in Table 1:

TABLE 1

Comparison of Emission Quantum Yields (QY) as a Function of Added Tellurium

| % Te Added to Core | Core/Shell Emission λ | $QY_{organic}$ | $QY_{water}$ |
|---|---|---|---|
| 1 | 691 | 0.94 | 0.84 |
| 2.5 | 755 | 0.94 | 0.78 |
| 5 | 808 | 0.55 | 0.40 |
| 10 | 868 | 0.29 | 0.24 |
| 100 | 725 | 0.81 | 0.01 |

The result in surprising but clear: these quantum dots not only became brighter initially as a function of small decreases in the amount of added tellurium, but also maintained this brightness even after dispersal in water. The invention thus enables the preparation of exceptionally stable composite core/overlayer nanoparticles.

We claim:

1. A method for preparing quantum dot nanoparticles that exhibit emission in the red or infrared spectral range which comprises: (i) combining a cadmium precursor, a selenium precursor, and a tellurium precursor in a solvent, wherein the mole ratio of tellurium to selenium is in the range of about 0.01 to about 0.10; (ii) inducing formation of a nanoparticle core using a first accelerant; (iii) combining the nanoparticle core with a solvent, a sulfur precursor, a second accelerant, and a cadmium precursor, a zinc precursor, or both a cadmium precursor and a zinc precursor, wherein at least one of the first accelerant and the second accelerant is a chemical promoter, wherein the cadmium precursor employed is a cadmium oxide, a halogenated cadmium compound, or a cadmium salt, wherein the nanoparticles have a peak emission wavelength that is at least 50 nm longer than that of identically sized nanoparticles composed of Cd and Se, and no Te.

2. The method of claim 1, wherein both the first accelerant and the second accelerant are chemical promoters.

3. A method for preparing quantum dot nanoparticles that exhibit emission in the red or infrared spectral range which comprises; (i) combining a cadmium precursor, a selenium precursor, and a tellurium precursor in a solvent, wherein the mole ratio of tellurium to selenium is in the range of about 0.01 to about 0.10; (ii) inducing formation of a nanoparticle core using a first accelerant; (iii) combining the nanoparticle core with a solvent, a sulfur precursor, a second accelerant, and a cadmium precursor, a zinc precursor, or both a cadmium precursor and a zinc precursor, wherein one of the first accelerant and the second accelerant is heat and the other is a chemical promoter, wherein the cadmium precursor employed is a cadmium oxide, a halogenated cadmium compound, or a cadmium salt, wherein the nanoparticles have a peak emission wavelength that is at least 50 nm longer than that of identically sized nanoparticles composed of Cd and Se, and no Te.

4. The method of claim 1, wherein the chemical promoter is a reducing agent capable of reducing cadmium(II), zinc(II), selenium(0), tellurium(0), or sulfur(0).

* * * * *